United States Patent
Feng et al.

(10) Patent No.: US 9,866,653 B2
(45) Date of Patent: Jan. 9, 2018

(54) DATA TRANSFER SYSTEM AND METHOD

(71) Applicant: Hitachi, Ltd., Chiyoda-ku, Tokyo (JP)

(72) Inventors: Yixiang Feng, Tokyo (JP); Masayuki Hariya, Tokyo (JP); Ichiro Kataoka, Tokyo (JP); Makoto Onodera, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 157 days.

(21) Appl. No.: 14/909,329

(22) PCT Filed: Aug. 2, 2013

(86) PCT No.: PCT/JP2013/070961
§ 371 (c)(1),
(2) Date: Feb. 1, 2016

(87) PCT Pub. No.: WO2015/015630
PCT Pub. Date: Feb. 5, 2015

(65) Prior Publication Data
US 2016/0182686 A1    Jun. 23, 2016

(51) Int. Cl.
H04L 29/06 (2006.01)
H03M 7/30 (2006.01)
H03M 13/03 (2006.01)
H04L 12/811 (2013.01)

(52) U.S. Cl.
CPC .......... H04L 67/42 (2013.01); H03M 7/6041 (2013.01); H03M 13/03 (2013.01); H04L 47/38 (2013.01)

(58) Field of Classification Search
CPC ...... H04L 67/42; H03M 13/03; H03M 7/6041
See application file for complete search history.

(56) References Cited

U.S. PATENT DOCUMENTS

| | | | | |
|---|---|---|---|---|
| 6,990,151 B2* | 1/2006 | Kim | ........ | H03M 7/30 348/E5.067 |
| 7,042,948 B2* | 5/2006 | Kim | ........ | H03M 7/30 348/E5.067 |
| 7,215,712 B2* | 5/2007 | Katsavounidis | ........ | H03M 7/30 348/E5.067 |
| 7,260,150 B2* | 8/2007 | Katsavounidis | ........ | H03M 7/30 348/E5.067 |

(Continued)

FOREIGN PATENT DOCUMENTS

| | | |
|---|---|---|
| JP | 10-21214 A | 1/1998 |
| JP | 11-215496 A | 8/1999 |

(Continued)

OTHER PUBLICATIONS

International Search Report (PCT/ISA/210) issued in PCT Application No. PCT/JP2013/070961 dated Nov. 5, 2013 with English translation (Four (4) pages).

*Primary Examiner* — Ranodhi Serrao
(74) *Attorney, Agent, or Firm* — Crowell & Moring LLP

(57) ABSTRACT

The present invention is a data transfer system that can transfer, with respect to simulation result data, physical quantities necessary for a user, further perform area division based on characteristics of physical quantities, designate an allowable range of a compression error according to a purpose for each of divided areas, compress the data on the basis of the designated error range, transfer the data, and further display an error of each of the divided areas for each of the physical quantities on a receiver/client side.

11 Claims, 9 Drawing Sheets

(56) References Cited

U.S. PATENT DOCUMENTS

| | | | |
|---|---|---|---|
| 7,643,977 B2* | 1/2010 | Bertini | G06F 17/5018 |
| | | | 174/110 A |
| 2005/0075847 A1 | 4/2005 | Yamada et al. | |
| 2005/0149831 A1* | 7/2005 | Katsavounidis | H03M 7/30 |
| | | | 714/776 |
| 2005/0254584 A1* | 11/2005 | Kim | H03M 7/30 |
| | | | 375/240.27 |
| 2006/0173660 A1* | 8/2006 | Itoh | G06F 17/5018 |
| | | | 703/2 |
| 2007/0046668 A1* | 3/2007 | Bertini | G06F 17/5018 |
| | | | 345/428 |
| 2007/0147519 A1 | 6/2007 | Takayama et al. | |
| 2007/0219770 A1* | 9/2007 | Lee | G06F 17/5009 |
| | | | 703/14 |
| 2008/0004850 A1* | 1/2008 | Wang | G06F 17/5018 |
| | | | 703/13 |
| 2009/0112522 A1* | 4/2009 | Rasmussen | G06F 1/26 |
| | | | 702/186 |
| 2011/0179095 A1 | 7/2011 | Watanabe | |

FOREIGN PATENT DOCUMENTS

| | | |
|---|---|---|
| JP | 4298749 B2 | 7/2009 |
| WO | WO 03/009183 A1 | 1/2003 |
| WO | WO 2005/083890 A1 | 9/2005 |
| WO | WO 2010/038259 A1 | 4/2010 |

* cited by examiner

[FIG. 1]
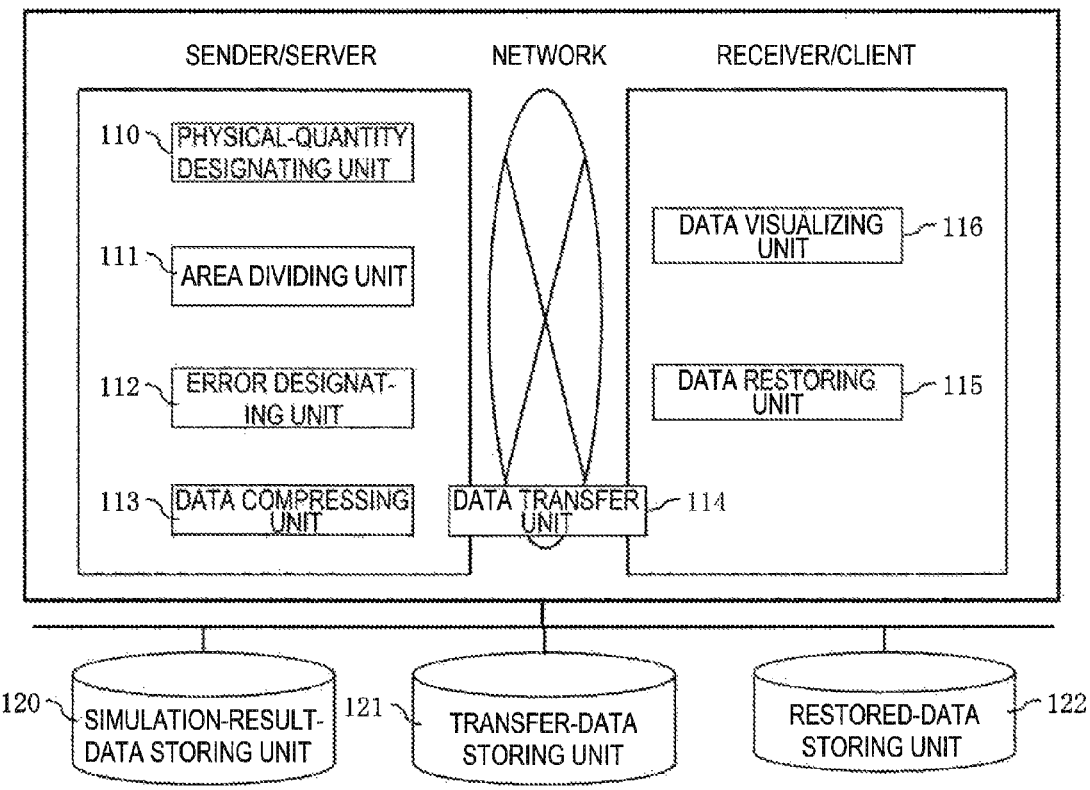

[FIG. 2]
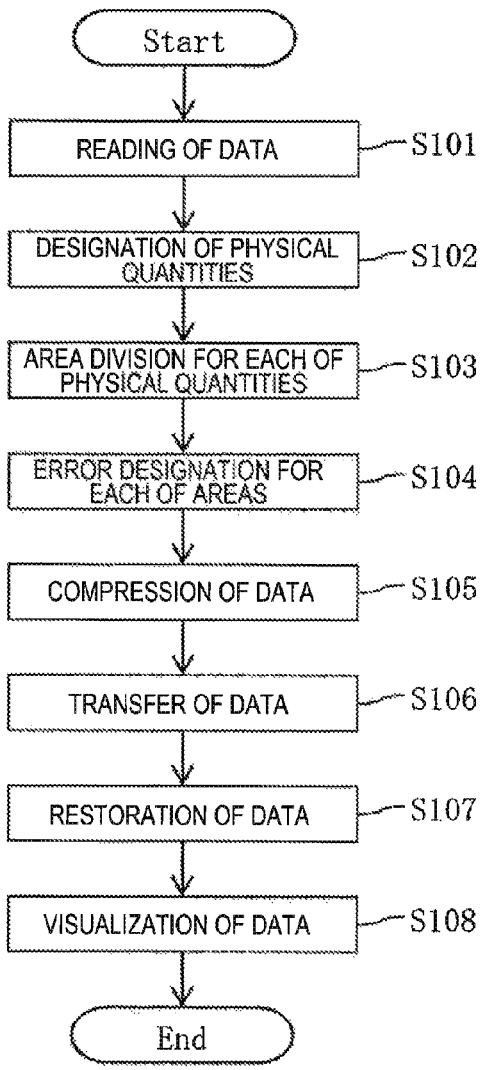
[FIG. 3]
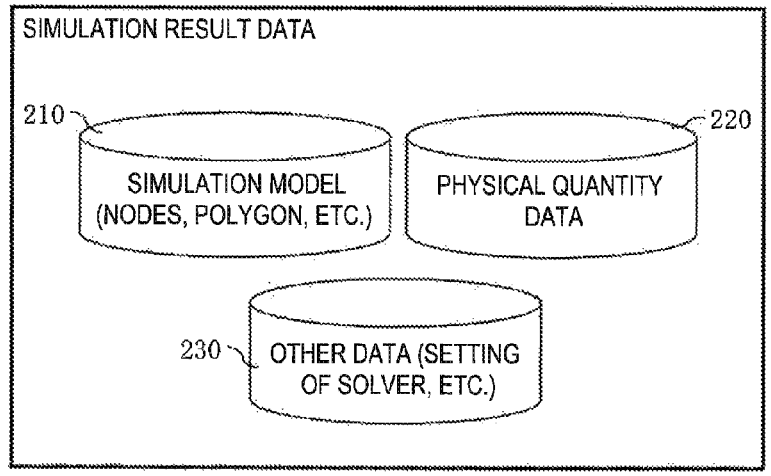

[FIG. 4]
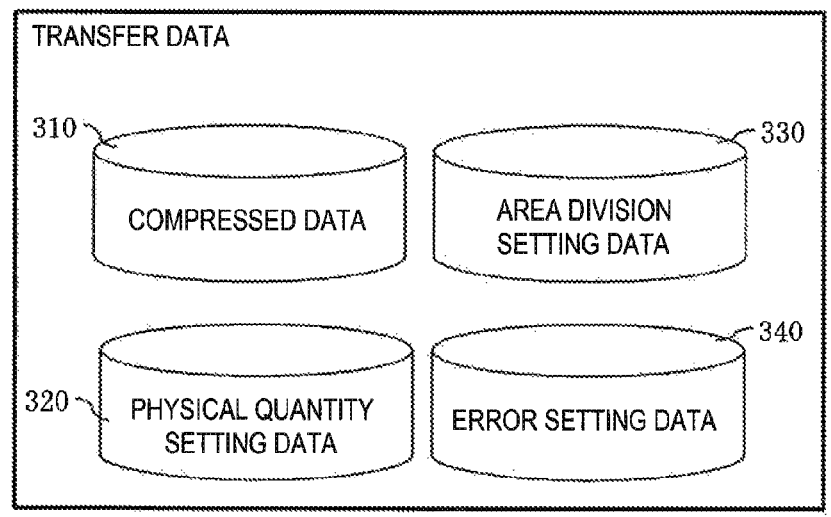
[FIG. 5]
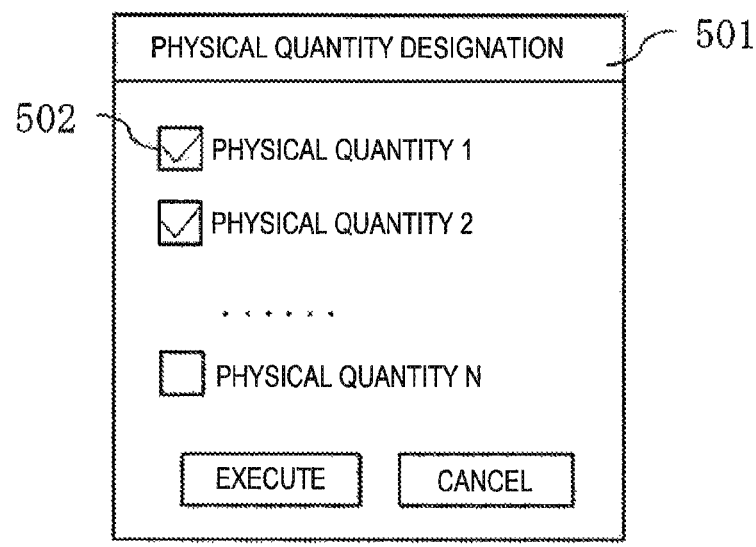

[FIG. 6]

```
                AREA DIVISION SETTING              ─ 601

PHYSICAL      ┌─────────────┐ ─ 602
    QUANTITY NAME └─────────────┘
    NUMBER OF     ┌─────────┐     ─ 603
    DIVISIONS    └─────────┘

SETTING OF AREA 1 :

MINIMUM      MAXIMUM

X COORDINATE  ┌──────┐     ┌──────┐
    Y COORDINATE  ┌──────┐     ┌──────┐    ─ 604
    Z COORDINATE  ┌──────┐     ┌──────┐

SETTING OF AREA 2 :
         ......

[ EXECUTE ]   [ CANCEL ]
```

[FIG. 7]

```
                ERROR SETTING              ─ 701

PHYSICAL      ┌─────────────────┐ ─ 702
    QUANTITY NAME └─────────────────┘

ERROR RANGE OF AREA 1 :

MINIMUM   ┌──────────┐
                                         ─ 703
        MAXIMUM   ┌──────────┐

ERROR RANGE OF AREA 2 :
         ......

[ EXECUTE ]   [ CANCEL ]
```

[FIG. 8]
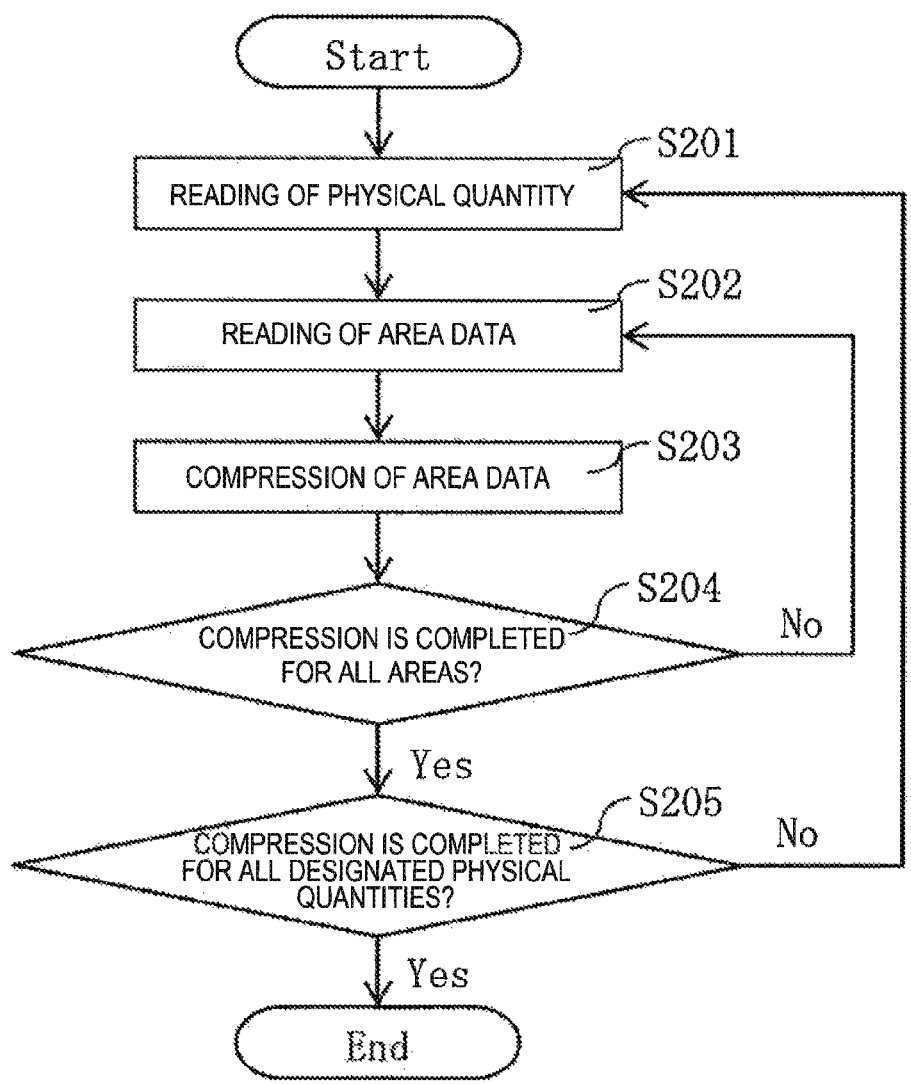

[FIG. 9]
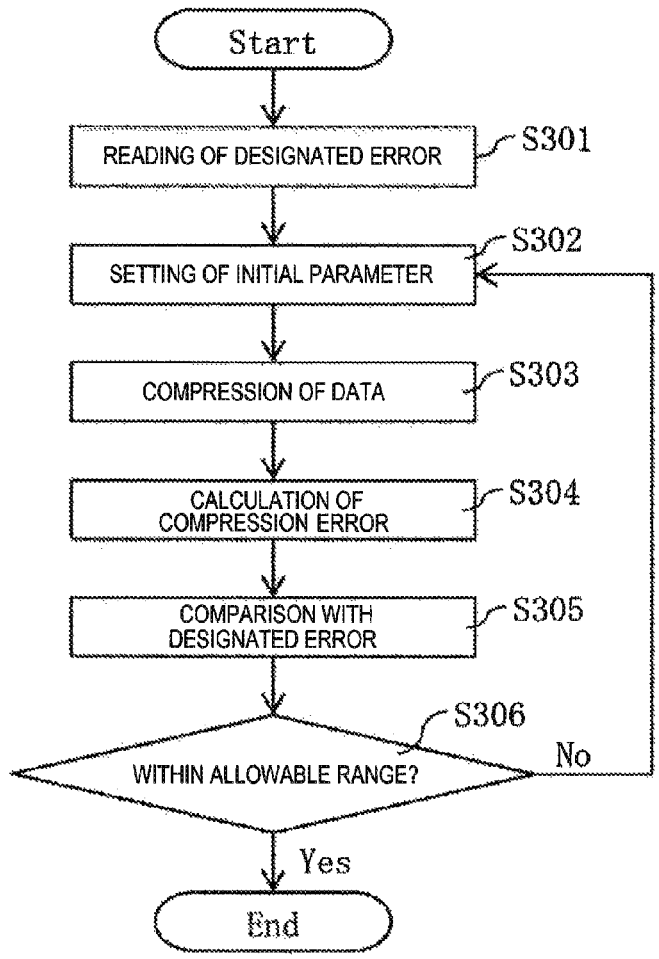
[FIG. 10]
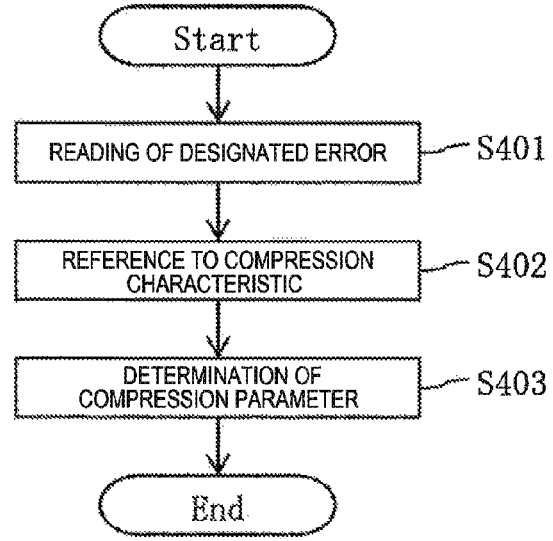

[FIG. 11]
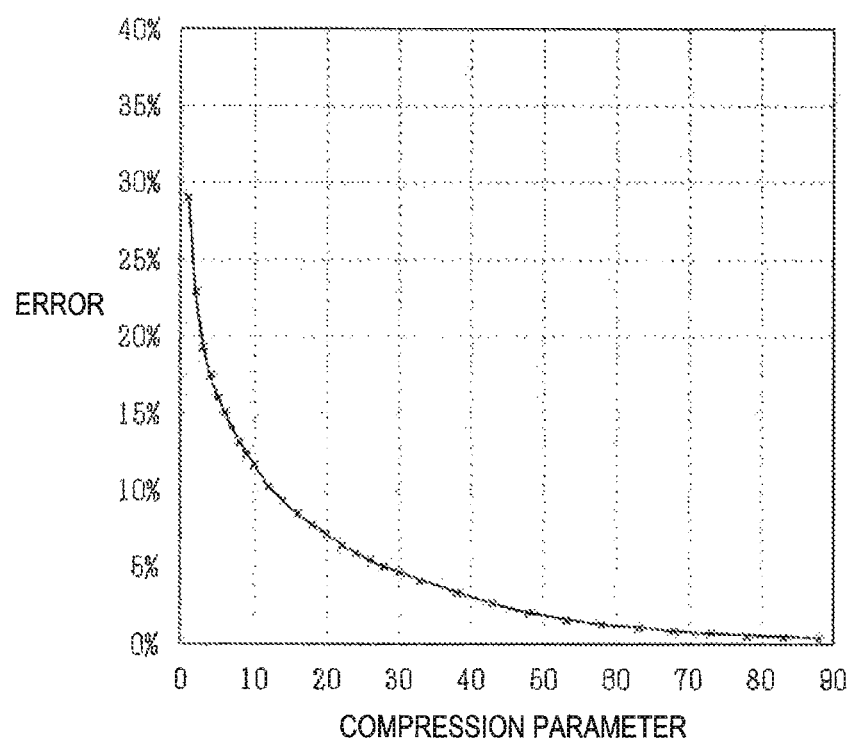

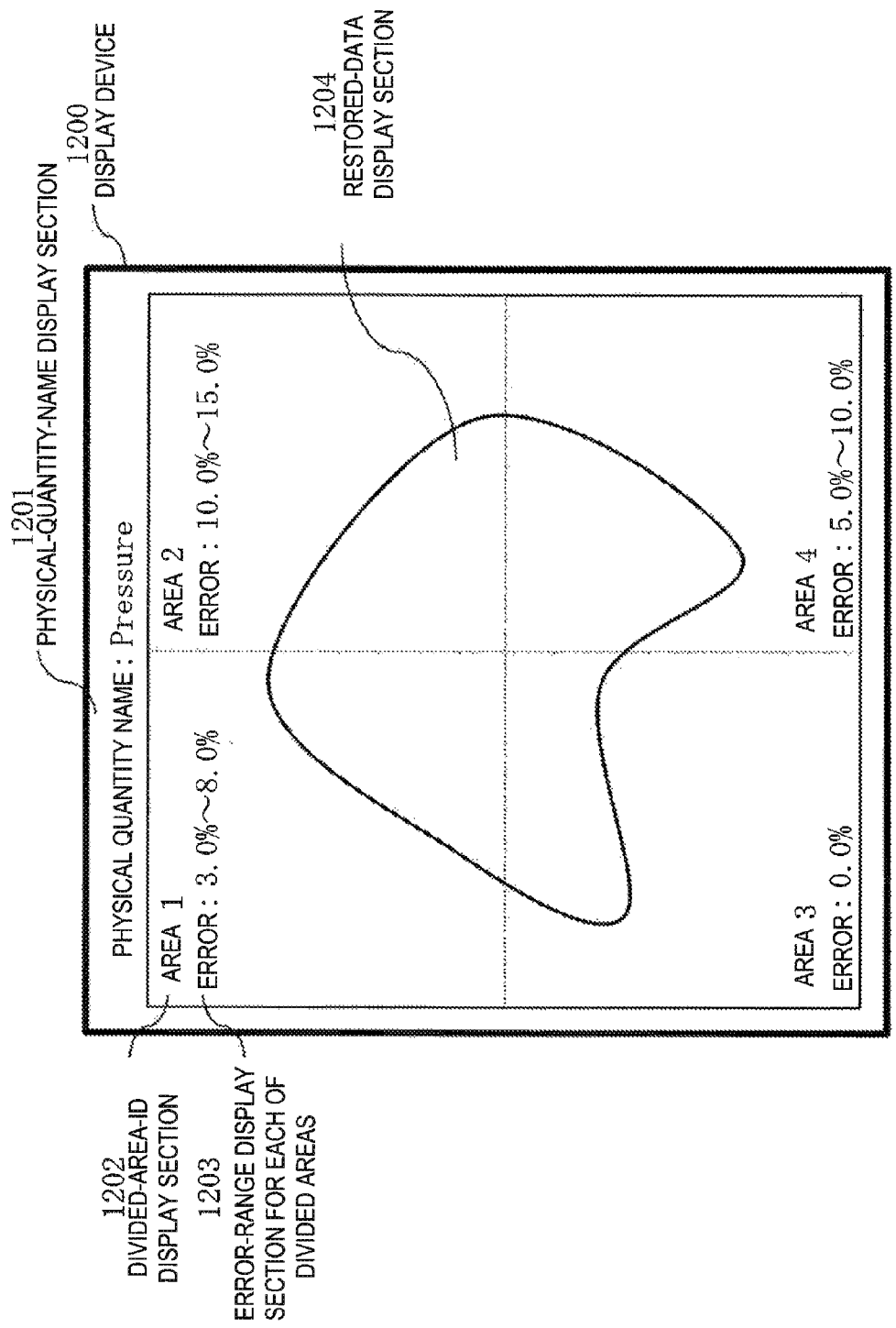
[FIG. 12]

[FIG. 13]
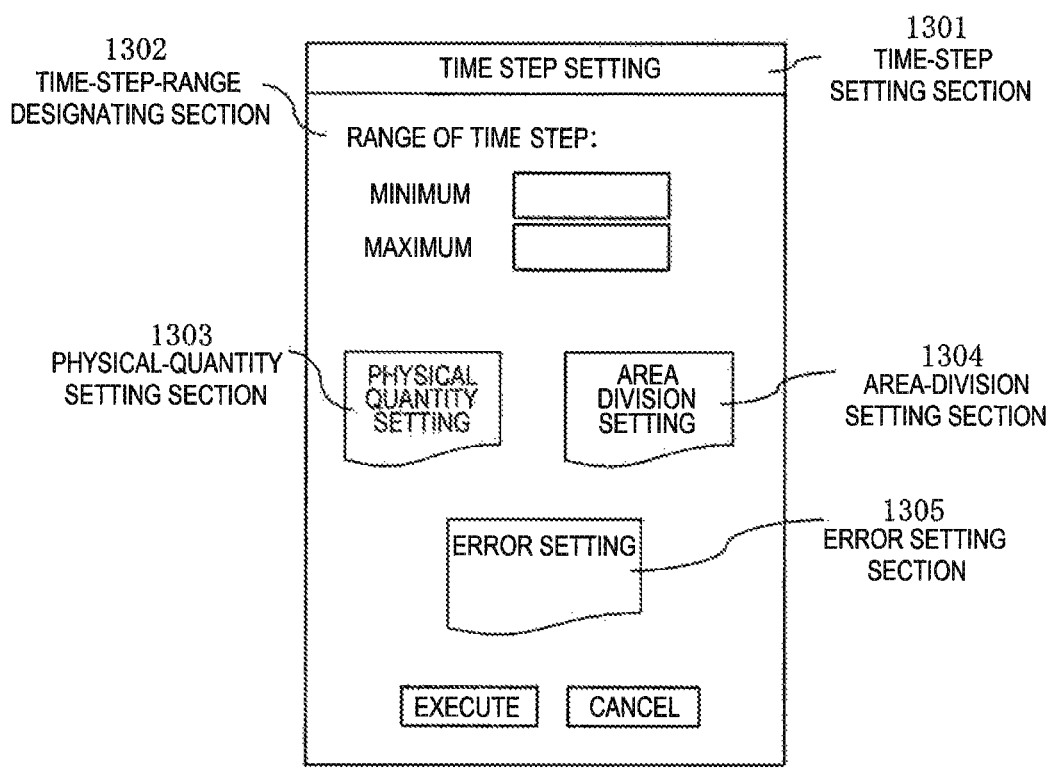

DATA TRANSFER SYSTEM AND METHOD

TECHNICAL FIELD

The present invention relates to a technique for transferring result data of a scientific calculation simulation and, more particularly, to a data transfer system and a date transfer method that can divide a simulation model into areas according to a physical quantity and designate a compression error of each of the areas such that an allowable error range designated by a user for each of physical quantities is satisfied during simulation result data transfer.

BACKGROUND ART

A technique for modeling components and products using a computer and simulating strength and fluid performance related to the products has been spreading. In recent years, access to simulation result data or transfer, visualization, and analysis of the data by a client in a server are increasing according to a remote communication technology represented by cloud computing. Therefore, there is a demand for a system and a method for efficiently transferring the simulation result data. On the other hand, the size of simulation data is becoming enormous according to the progress of computer performance represented by a super computer. Therefore, concerning the transfer of the data, it is desired to compress the data with some method and then transfer the data.

For example, as described in [Patent Literature 1] below, in general, a conventional data transfer system proposed in such a background divides data into predetermined blocks, performs irreversible compression for each of the blocks, and then transfers the data. The data is expanded/restored on a receiver/client side.

As an irreversible data compression technique, for example, as described in [Patent Literature 2] below, there is a method of dividing time-series data into designated segment width and compressing the data according to singular value decompression.

CITATION LIST

Patent Literature

Patent Literature 1: JP-A-11-215496
Patent Literature 2: Japanese Patent No. 4298749 (WO2005/083890)

SUMMARY OF INVENTION

Technical Problem

The conventional data transfer system has problems described below.

A first problem is that an allowable value of an error cannot be designated for each of areas of a simulation model. For a user who uses simulation result data, understanding and grasp of a physical phenomenon are important. Therefore, an error is desirably reduced concerning an area deeply related to the physical phenomenon. Conversely, an error may be large concerning an area remotely related to the physical phenomenon. However, for example, as described in [Patent Literature 1], the conventional data transfer system often focuses on a compression ratio of data. As a result, concerning the data after the compression, even if the compression ratio is high, it is not guaranteed that an error is reduced within an error desired by the user.

A second problem is that area/block division is not performed for each of physical quantities. Concerning the physical phenomenon, since a phenomenon is different depending on a physical quantity, it is desirable that the area division can be performed according to a characteristic of the physical quantity. However, in the conventional data transfer system, the area division cannot be performed according to the characteristic of the physical quantity.

A third problem is that, when restored data is displayed on the receiver/client side, only the data and a visual point are displayed. Information such as an error set before transfer is not displayed on the receiver/client side. In such a system, even if the restored data is displayed, the receiver/client side cannot grasp how many errors are included in the displayed data. Therefore, a data analysis and understanding are prevented.

Solution to Problem

In order to solve the problems, the present invention is characterized by a configuration described below. That is, the present invention provides a system that transfers simulation result data including one or more physical quantities, the data transfer system including:

a physical-quantity designating unit that designates, out of the physical quantities, physical quantities that should be transferred;

an area dividing unit that performs, for each of the physical quantities designated by the physical-quantity designating unit, area division of a simulation model included in the simulation result data;

an error designating unit that designates an allowable error range for each of areas divided by the area dividing unit;

a data compressing unit that performs irreversible data compression on the basis of the error designated by the error designating unit;

a data transfer unit that transfers compressed data obtained by the data compressing unit, physical quantity setting data obtained by the physical-quantity designating unit, area division setting data obtained by the area dividing unit, and error setting data obtained by the error designating unit to a receiver/client via a network;

a data restoring unit that restores the compressed data on the receiver/client side; and a data visualizing unit that visualizes, on the receiver/client side, the data restored by the data restoring unit.

Further, in the data transfer system according to the present invention, the data transfer system may transfer only the physical quantities designated by the physical-quantity designating unit.

Further, in the data transfer system according to the present invention, the data visualizing unit may concurrently display names of the physical quantities and the error designated for each of the areas.

In order to solve the problems, the present invention provides a system that transfers simulation result data including a plurality of physical quantities, the data transfer system including:

a physical-quantity designating unit that designates, out of the physical quantities, physical quantities that should be transferred;

an area dividing unit that performs, for each of the physical quantities designated by the physical-quantity designating unit, area division of a simulation model included in the simulation result data;

an error designating unit that designates an allowable error range for each of areas divided by the area dividing unit;

a data compressing unit that performs irreversible data compression on the basis of the error designated by the error designating unit; and a data transfer unit that transfers compressed data obtained by the data compressing unit, physical quantity setting data obtained by the physical-quantity designating unit, area division setting data obtained by the area dividing unit, and error setting data obtained by the error designating unit to a receiver/client via a network.

Further, the data transfer system according to the present invention may further include: a data restoring unit that restores the compressed data on the receiver/client side; and a data visualizing unit that visualizes, on the receiver/client side, the data restored by the data restoring unit.

Further, in the data transfer system according to the present invention, the data transfer system may transfer only the physical quantities designated by the physical-quantity designating unit.

Further, in the data transfer system according to the present invention, the data visualizing unit may concurrently display names of the physical quantities and the error designated for each of the areas.

In order to solve the problems, the present invention provides a system that transfers simulation result data including a plurality of physical quantities, the data transfer system including:

a physical-quantity designating unit that designates, out of the physical quantities, physical quantities that should be transferred;

an area dividing unit that performs, for each of the physical quantities designated by the physical-quantity designating unit, area division of a simulation model included in the simulation result data;

an error designating unit that designates an allowable error range for each of areas divided by the area dividing unit;

a data compressing unit that performs irreversible data compression on the basis of the error designated by the error designating unit;

a data transfer unit that transfers compressed data obtained by the data compressing unit, physical quantity setting data obtained by the physical-quantity designating unit, area division setting data obtained by the area dividing unit, and error setting data obtained by the error designating unit to a receiver/client via a network;

a data restoring unit that restores the compressed data on the receiver/client side; and a data visualizing unit that visualizes, on the receiver/client side, the data restored by the data restoring unit, wherein the data visualizing unit concurrently displays names of the physical quantities and the error designated for each of the areas.

Further, in the data transfer system according to the present invention, the data transfer system may transfer only the physical quantities designated by the physical-quantity designating unit.

In order to solve the problems, the present invention provides a data transfer method including:

a physical-quantity designating step for designating, out of physical quantities included in simulation result data, physical quantities that should be transferred;

an area dividing step for performing, for each of the physical quantities designated in the physical-quantity designating step, area division of a simulation model included in the simulation result data;

an error designating step for designating an allowable error range for each of areas divided in the area dividing step;

a data compressing step for performing irreversible data compression on the basis of the error designated in the error designating step;

a data transfer step for transferring compressed data obtained in the data compressing step, physical quantity setting data obtained in the physical-quantity designating step, area division setting data obtained in the area dividing step, and error setting data obtained in the error designating step to a receiver/client via a network;

a data restoring step for restoring the compressed data on the receiver/client side; and a data visualizing step for visualizing, on the receiver/client side, the data restored in the data restoring step.

Further, in the data transfer method according to the present invention, only the physical quantities designated in the physical quantity designating step may be transferred.

Further, in the data transfer method according to the present invention, in the data visualizing step, names of the physical quantities and the error designated for each of the areas may be concurrently displayed.

Advantageous Effect of Invention

As explained above, according to the present invention, it is possible to transfer only physical quantities necessary for a user.

Further, it is possible to perform, according to designated physical quantities, area division based on characteristics of the physical quantities. It is possible to compress data on the basis of an error designated according to a purpose for each of areas and transfer the data.

In the data compression, since a configuration for adjusting a compression parameter within a designated error range is adopted, it is guaranteed that an error falls within an error range designated by the user.

Further, since an error for each of the divided areas is displayed for each of the physical quantities on the receiver/client side, the user can grasp accuracy of displayed restored data and perform appropriate data analysis processing.

Consequently, it is possible to realize efficient data transfer system for the user to understand a physical phenomenon included in a simulation result model.

BRIEF DESCRIPTION OF THE DRAWINGS

FIG. 1 is a configuration diagram of a data transfer system according to a first embodiment of the present invention.

FIG. 2 is an example of a flowchart of the data transfer system according to the first embodiment of the present invention.

FIG. 3 is an example of a configuration diagram of simulation result data.

FIG. 4 is an example of a configuration diagram of transfer data.

FIG. 5 is an example of a user interface of a physical-quantity designating unit included in the data transfer system shown in FIG. 1.

FIG. 6 is a user interface of an area dividing unit included in the data transfer system shown in FIG. 1.

FIG. 7 is an example of a user interface of an error designating unit included in the data transfer system shown in FIG. 1.

FIG. 8 is an example of a flowchart related to data compressing means.

FIG. 9 is an example of a flowchart for explaining a method of adjusting a compression parameter according to repetition.

FIG. 10 is an example of a flowchart for explaining a method of determining the compression parameter referring to a compression characteristic.

FIG. 11 is an example of a compression characteristic chart.

FIG. 12 is an example of a display screen in displaying simulation result data after compression.

FIG. 13 is an example of a user interface of time step setting.

DESCRIPTION OF EMBODIMENTS

Embodiments of the present invention are explained below with reference to the drawings.

First Embodiment

An embodiment of the present invention is explained below with reference to the drawings.

First, a configuration diagram of a data transfer system is explained with reference to FIG. 1. A flowchart of a data transfer procedure is shown in FIG. 2. Simulation result data is shown in FIG. 3.

In FIG. 1, a physical-quantity designating unit 110 selects, from a list of physical quantities included in simulation result data, physical quantity that a user determines should be transferred.

Steps of the flowchart of FIG. 2 include steps explained below.

In step (hereinafter referred to as S) 101, reading of target data is performed.

In S102, in a sender/server, the physical-quantity designating unit 110 performs designation of physical quantities.

In S103, an area dividing unit 111 performs area division for each of the physical quantities.

In S104, an error designating unit 112 performs error designation for each of areas.

In S105, a data compressing unit 113 performs compression of data.

In S106, a data transfer unit 114 performs transfer of data via a network.

In S107, in a receiver/client, a data restoring unit 115 performs restoration of the data.

In S108, in the receiver/client, a data visualizing unit 116 performs visualization of the data.

As indicated by the simulation result data shown in FIG. 3, the simulation result data includes a simulation model 210 including node data and polygon/mesh data, physical quantity data 220, and other data 230 such as setting of a solver.

As indicated by transfer data shown in FIG. 4, the transfer data includes compressed data 310, physical quantity setting data 320, area division setting data 330, and error setting data 340.

An example of a user interface of the physical-quantity designating unit 110 is shown in FIG. 5. In the interface shown in FIG. 5, a physical-quantity designation window 501 and a checkbox 502 for physical quantity designation in the physical-quantity designation window 501 are shown.

The area dividing unit 111 shown in FIG. 1 divides, concerning all physical quantities designated by the physical-quantity designating unit 110, the simulation model included in the simulation result data shown in FIG. 3 into a plurality of areas.

FIG. 6 is an example of a user interface of the area dividing unit 111. In FIG. 6, an area-division setting window 601, a physical-quantity-name input section 602 in the area-division setting window 601, a number-of-area-divisions input section 603 in the area-division setting window 601, and a division-reference input section 604 for each of areas in the area-division setting window 601 are shown. A system for inputting minimums and maximums of an X coordinate, a Y coordinate, and a Z coordinate for the respective areas is described. However, a system for selecting, with a mouse or the like, analysis target polygon/mesh data displayed on a screen may be adopted.

The error designating unit 112 designates, concerning all the areas divided by the area dividing unit 111, an error range by compression. A definition of the error is, for example, the following expression.

Error=(norm of differential data/norm of data before compression)×100%

Note that the differential data is a difference between the data before compression and the data after compression. The norm means a Frobenius norm.

FIG. 7 is an example of a user interface of the error designating unit 112. The user can input an error range for respective areas of a physical quantity selected by the user. In FIG. 7, an error setting window 701, a physical-quantity-name input section 702 in the error setting window 701, and an error-range input section 703 for each of areas in the error setting window 701 are shown. Note that, in this embodiment, the range of the error is input. However, only a maximum of the error may be able to be input. In this case, a minimum error may be set to 0.0.

The data compressing unit 113 sets, concerning all the areas divided by the area dividing unit 111, a compression parameter according to the error designated by the error designating unit 112 and performs compression such that the error falls within a designated error range.

FIG. 8 is an example of a flowchart of the data compressing unit 113. FIG. 8 indicates that data is compressed for each of designated areas concerning designated all physical quantities.

Steps of the flowchart of FIG. 8 include steps explained below.

In S201, the data compressing unit 113 performs reading of a target physical quantity.

In S202, the data compressing unit 113 performs reading of area data.

In S203, the data compressing unit 113 performs compression of the area data.

In S204, the data compressing unit 113 determines whether the compression is completed for all the areas. If the compression is not completed for all the areas, the data compressing unit 113 returns to S202.

In S205, the data compressing unit 113 determines whether the compression is completed for all the designated physical quantities. If the compression is not completed for all the designated physical quantities, the data compressing unit 113 returns to S201.

One of parameter adjusting methods for compressing the error to fall within the error range in the "compression of the area data" of the flowchart of FIG. 8 is explained with reference to a flowchart of FIG. 9.

In S301, the data compressing unit 113 performs reading of a designated error.

In S302, the data compressing unit 113 performs setting of an initial parameter.

In S303, the data compressing unit 113 performs data compression using the initial parameter.

In S304, the data compressing unit 113 performs calculation of a compression error.

In S305, the data compressing unit 113 performs comparison of an error and the designated error.

When a comparison result of the error and the designated error is not within an error range, the data compressing unit 113 returns to S302.

Consequently, the data compressing unit 113 corrects a value of the parameter such that the error falls within the error range, performs the data compression again, and calculates an error. The data compressing unit 113 repeats this process until the error falls within the error range.

For example, when data is compressed using singular value decomposition, it is possible to approximate an original matrix by sorting N singular values in order from a largest singular value and using large R singular values. Note that R<=N. In this case, when the method explained above is applied, a compression parameter is R. An error is reduced by increasing R. In the case of R=N, the error is zero, which is equal to non-compression.

The data transfer unit 114 transfers, via a network, transfer data stored in a transfer-data storing unit 121 from the sender/server to the receiver/client. The transfer data includes, as shown in FIG. 4, the compressed data 310, the physical quantity setting data 320, the area division setting data 330, and the error setting data 340. The compressed data 310 is obtained from the data compressing unit 113. For example, when the singular value decomposition is used, the compressed data is the R singular values and a singular vector. The physical quantity setting data 320 is names of all the physical quantities designated by the physical-quantity designating unit 110. The area division setting data 330 is information concerning the area division for each of the physical quantities designated by the area dividing unit 111. The error setting data 340 is an allowable range of the errors of the respective areas designated by the error designating unit 112.

The data restoring unit 115 restores, with operation opposite to the data compression, the compressed data 310 received by the data transfer unit 114. For example, when the singular value decomposition is used, the data restoring unit 115 calculates a product of a diagonal matrix including singular values and a singular vector.

The data visualizing unit 116 displays, on a display device, restored data restored by the data restoring unit 115. In displaying the restored data, the data visualizing unit 116 displays names of physical quantities using the physical quantity setting data 320. The data visualizing unit 116 displays an error for each of the areas using the area division setting data 330 and the error setting data 340.

FIG. 12 is an example of a display screen in realizing, in the display device, the data visualizing unit 116 explained above. In FIG. 12, in a physical-quantity-name display section 1201, a name of a physical quantity being displayed is displayed. In a divided-area-ID display section 1202, in respective divided areas, IDs or names of the areas are displayed. In an error-range display section 1203 for each of the divided areas, in the respective divided areas, error ranges of the areas are displayed.

In a restored-data display section 1204, restored data restored by the data restoring unit 115 is displayed. It is assumed that the user designates physical quantities used in displaying the restored data.

In an area 1, restored data 1204 under a condition that an error is 3.0% to 8.0% is shown.

In an area 2, the restored data 1204 under a condition that an error is 10.0% to 15.0% is shown.

In an area 3, the restored data 1204 under a condition that an error is 0.0% is shown.

In an area 4, the restored data 1204 under a condition that an error is 5.0% to 10.0% is shown.

The display is performed in a display device 1200 such as a display of a personal computer.

As explained above, with the data transfer system according to the embodiment of the present invention, information such as an error set before transfer is displayed on the receiver/client side. Therefore, in processing data, the user on the receiver/client side can perform analysis and interpretation corresponding to the magnitude of the error. For example, detailed analysis is performed for an area with a small error and schematic analysis is performed for an area with a large error.

Second Embodiment

Another embodiment of the present invention is explained below with reference to the drawings.

A basic configuration of this embodiment is the same as the basic configuration of the first embodiment. Therefore, the same components are denoted by the same reference numerals and signs and explanation of the components is omitted. Main differences from the first embodiment are as explained below.

A definition of an error in this embodiment is, for example, the following expression.

$$\text{Error} = (\text{norm of differential data/range of data before compression}) \times 100\%$$

However, the differential data is a difference between data before compression and data after compression. The range of the data is an absolute value of a difference between a maximum and a minimum of a relevant physical quantity in a relevant area.

Third Embodiment

Another embodiment of the present invention is explained below with reference to the drawings.

A basic configuration of this embodiment is the same as the basic configuration of the first embodiment. Therefore, the same components are denoted by the same reference numerals and signs and explanation of the components is omitted. Main differences from the first embodiment are as explained below.

A method of determining a compression parameter to compress data to fall within a designated error range referring to a compression characteristic is explained with reference to FIG. 10.

First, in S401, reading of a designated error is performed.

In S402, a compression characteristic is acquired before data compression. The compression characteristic means a figure, a list, or a table characterized by showing a relation between a compression error and a compression ratio due to a change in the compression parameter. For example, when singular value decomposition is used, the compression characteristic has a characteristic that the compression error decreases as the number of singular values to be selected increases. In S403, the compression parameter is determined.

Graph data of an example in which the compression characteristic is quantitatively represented is shown in FIG. 11. As shown in FIG. 11, referring to the graph data of the compression characteristic showing a relation between an error and the compression parameter, it is possible to realize selection of the compression parameter such that the error falls within the error range.

Fourth Embodiment

Another embodiment of the present invention is explained below.

A basic configuration of this embodiment is the same as the basic configuration of the first embodiment. Therefore, the same components are denoted by the same reference numerals and signs and explanation of the components is omitted. Main differences from the first embodiment are as explained below.

Simulation result data is sometimes time-series data. In this case, in this embodiment, it is possible to apply setting information of the physical quantity designation, the area selection, and the error designation to all time steps. It is also possible to apply different setting information to each of the time steps.

FIG. 13 is an example of a user interface of time step setting. In FIG. 13, a user inputs a minimum time step and a maximum time step using a time-step-range designating section 1302. Besides, the user performs setting of physical quantities using a physical-quantity setting section 1303, performs setting concerning area division using an area-division setting section 1304, and performs setting concerning an error using an error setting section 1305. The setting of the physical quantities, the setting of the area division, and the setting of the error are effective for data between the minimum time step and the maximum time step.

Further, the data visualizing unit displays information concerning the time steps together with physical quantity names, an error range, and restored data.

Fifth Embodiment

Another embodiment of the present invention is explained below.

A basic configuration of this embodiment is the same as the basic configuration of the first embodiment. Therefore, the same components are denoted by the same reference numerals and signs and explanation of the components is omitted. Main differences from the fourth embodiment are as explained below. In the case of time-series simulation result data, in order to more efficiently compress and transfer the data, differential data between preceding and following time steps is calculated and the method of the first embodiment is applied to the differential data.

For explanation, time-series simulation data including a maximum time step tmax is represented as A(1), A(2), ... , and A(tmax). A definition of the differential data in this embodiment is, for example, the following expression.

$$B(1)=A(1)$$

$$B(t)=A(t)-A(t-1)$$

In the expression, t represents a time step and is an integer between 2 and tmax.

After the above calculation is performed, data transfer is performed for differential data B by the method described in the fourth embodiment.

On the receiver/client side, the differential data B is restored. Restored data is represented as BB. Restored data AA of data A is calculated, for example, using the following expression.

$$AA(1)=BB(1)$$

$$AA(t)=BB(t)+AA(t-1)$$

In the expression, t represents a time step and is an integer between 2 and tmax.

The preferred embodiments of the present invention are explained above. However, it goes without saying that the present invention is not limited to the embodiments.

With the data transfer system according to the embodiments of the present invention, it is possible to transfer only physical quantities necessary for the user.

Further, it is possible to perform, according to designated physical quantities, area division based on characteristics of the physical quantities. It is possible to compress data on the basis of an error designated according to a purpose for each of areas and transfer the data.

In the data compression, a configuration is adopted in which a compression parameter is adjusted to fall within a designated error range. Therefore, it is guaranteed that an error falls within an error range designated by the user for each of divided areas.

Further, since an error of each of the divided areas is displayed for each of the physical quantities on the receiver/client side, the user can grasp accuracy of displayed restored data and perform appropriate data analysis processing.

It is possible to realize an efficient data transfer system for the user to understand a physical phenomenon included in a simulation result model.

REFERENCE SIGNS LIST 110 physical-quantity designating unit
111 area dividing unit
112 error designating unit
113 data compressing unit
114 data transfer unit
115 data restoring unit
116 data visualizing unit
120 simulation-result-data storing unit
121 transfer-data storing unit
122 restored-data storing unit
210 simulation model
220 physical quantity data
230 other data
310 compressed data
320 physical quantity setting data
330 area division setting data
340 error setting data
501 physical-quantity designation window
502 checkbox for physical quantity designation in the physical-quantity designation window
601 area-division setting window
602 physical-quantity-name input section in the area-division setting window
603 number-of-area-divisions input section in the area-division setting window
604 division-reference input section for each of areas in the area-division setting window
701 error setting window 702 physical-quantity-name input section in the error setting window
703 error-range input section for each of areas in the error setting window
1200 display device
1201 physical-quantity-name display section
1202 divided-area-ID display section
1203 error-range display section for each of divided areas
1204 simulation-result-data-after-compression display section

The invention claimed is:

1. A system that transfers simulation result data including a plurality of physical quantities, the data transfer system comprising:
a physical-quantity designating unit that designates, out of the physical quantities, physical quantities that should be transferred;
an area dividing unit that performs, for each of the physical quantities designated by the physical-quantity designating unit, area division of a simulation model included in the simulation result data;
an error designating unit that designates an allowable error range for each of areas divided by the area dividing unit;
a data compressing unit that performs irreversible data compression on the basis of the error designated by the error designating unit;
a data transfer unit that transfers compressed data obtained by the data compressing unit, physical quantity setting data obtained by the physical-quantity designating unit, area division setting data obtained by the area dividing unit, and error setting data obtained by the error designating unit to a receiver/client via a network;
a data restoring unit that restores the compressed data on the receiver/client side; and
a data visualizing unit that visualizes, on the receiver/client side, the data restored by the data restoring unit.

2. The data transfer system according to claim 1, wherein the data transfer system transfers only the physical quantities designated by the physical-quantity designating unit.

3. The data transfer system according to claim 1, wherein the data visualizing unit concurrently displays names of the physical quantities and the error designated for each of the areas.

4. A system that transfers simulation result data including a plurality of physical quantities, the data transfer system comprising:
a physical-quantity designating unit that designates, out of the physical quantities, physical quantities that should be transferred;
an area dividing unit that performs, for each of the physical quantities designated by the physical-quantity designating unit, area division of a simulation model included in the simulation result data;
an error designating unit that designates an allowable error range for each of areas divided by the area dividing unit;
a data compressing unit that performs irreversible data compression on the basis of the error designated by the error designating unit; and
a data transfer unit that transfers compressed data obtained by the data compressing unit, physical quantity setting data obtained by the physical-quantity designating unit, area division setting data obtained by the area dividing unit, and error setting data obtained by the error designating unit to a receiver/client via a network;
wherein the data transfer system transfers only the physical quantities designated by the physical-quantity designating unit.

5. The data transfer system according to claim 4, further comprising:
a data restoring unit that restores the compressed data on the receiver/client side; and
a data visualizing unit that visualizes, on the receiver/client side, the data restored by the data restoring unit.

6. The data transfer system according to claim 5, wherein the data visualizing unit concurrently displays names of the physical quantities and the error designated for each of the areas.

7. A system that transfers simulation result data including a plurality of physical quantities, the data transfer system comprising:
a physical-quantity designating unit that designates, out of the physical quantities, physical quantities that should be transferred;
an area dividing unit that performs, for each of the physical quantities designated by the physical-quantity designating unit, area division of a simulation model included in the simulation result data;
an error designating unit that designates an allowable error range for each of areas divided by the area dividing unit;
a data compressing unit that performs irreversible data compression on the basis of the error designated by the error designating unit;
a data transfer unit that transfers compressed data obtained by the data compressing unit, physical quantity setting data obtained by the physical-quantity designating unit, area division setting data obtained by the area dividing unit, and error setting data obtained by the error designating unit to a receiver/client via a network;
a data restoring unit that restores the compressed data on the receiver/client side; and
a data visualizing unit that visualizes, on the receiver/client side, the data restored by the data restoring unit, wherein
the data visualizing unit concurrently displays names of the physical quantities and the error designated for each of the areas.

8. The data transfer system according to claim 7, wherein the data transfer system transfers only the physical quantities designated by the physical-quantity designating unit.

9. A data transfer method comprising:
a physical-quantity designating step for designating, out of physical quantities included in simulation result data, physical quantities that should be transferred;
an area dividing step for performing, for each of the physical quantities designated in the physical-quantity designating step, area division of a simulation model included in the simulation result data;
an error designating step for designating an allowable error range for each of areas divided in the area dividing step;
a data compressing step for performing irreversible data compression on the basis of the error designated in the error designating step;
a data transfer step for transferring compressed data obtained in the data compressing step, physical quantity setting data obtained in the physical-quantity designating step, area division setting data obtained in the area dividing step, and error setting data obtained in the error designating step to a receiver/client via a network;

a data restoring step for restoring the compressed data on the receiver/client side; and a data visualizing step for visualizing, on the receiver/client side, the data restored in the data restoring step.

10. The data transfer method according to claim 9, wherein only the physical quantities designated in the physical quantity designating step are transferred.

11. The data transfer method according to claim 9, wherein, in the data visualizing step, names of the physical quantities and the error designated for each of the areas are concurrently displayed.

* * * * *